United States Patent
Khare et al.

(10) Patent No.: US 9,998,401 B2
(45) Date of Patent: *Jun. 12, 2018

(54) ARCHITECTURE FOR ON-DIE INTERCONNECT

(71) Applicant: Intel Corporation, Santa Clara, CA (US)

(72) Inventors: Surhud Khare, Bangalore (IN); Ankit More, Hillsboro, OR (US); Dinesh Somasekhar, Portland, OR (US); David S. Dunning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 165 days.

This patent is subject to a terminal disclaimer.

(21) Appl. No.: 15/042,402

(22) Filed: Feb. 12, 2016

(65) Prior Publication Data

US 2016/0173413 A1    Jun. 16, 2016

Related U.S. Application Data

(63) Continuation of application No. 14/524,622, filed on Oct. 27, 2014, now Pat. No. 9,287,208.

(51) Int. Cl.
| | |
|---|---|
| *H04L 25/00* | (2006.01) |
| *H04L 12/933* | (2013.01) |
| *H01L 23/522* | (2006.01) |
| *H01L 23/528* | (2006.01) |

(52) U.S. Cl.
CPC ......... *H04L 49/109* (2013.01); *H01L 23/528* (2013.01); *H01L 23/5221* (2013.01); *H01L 2924/0002* (2013.01)

(58) Field of Classification Search
CPC ... H04L 49/109; H04L 45/16; H04L 23/5221; H04L 2924/00; H01L 2924/00; H03F 3/245; H03F 3/19
See application file for complete search history.

(56) References Cited

U.S. PATENT DOCUMENTS

| | | | |
|---|---|---|---|
| 6,289,021 | B1 | 9/2001 | Hesse |
| 6,693,357 | B1 | 2/2004 | Borst |

(Continued)

FOREIGN PATENT DOCUMENTS

| | | |
|---|---|---|
| CN | 102270187 | 12/2011 |
| RU | 2447594 | 10/2012 |

(Continued)

OTHER PUBLICATIONS

European Patent Office, Extended European Search Report dated Mar. 21, 2016 in European Patent Application No. 15184760.5.

(Continued)

*Primary Examiner* — Shukri Taha
(74) *Attorney, Agent, or Firm* — Trop, Pruner & Hu, P.C.

(57) ABSTRACT

In an embodiment, an apparatus includes: a plurality of islands configured on a semiconductor die, each of the plurality of islands having a plurality of cores; and a plurality of network switches configured on the semiconductor die and each associated with one of the plurality of islands, where each network switch includes a plurality of output ports, a first set of the output ports are each to couple to the associated network switch of an island via a point-to-point interconnect and a second set of the output ports are each to couple to the associated network switches of a plurality of islands via a point-to-multipoint interconnect. Other embodiments are described and claimed.

20 Claims, 9 Drawing Sheets

(56) References Cited

U.S. PATENT DOCUMENTS

| | | | |
|---|---|---|---|
| 8,710,667 B2 | 4/2014 | Hirano | |
| 8,873,554 B2 * | 10/2014 | Baban | H04L 45/16 370/390 |
| 9,153,508 B2 | 10/2015 | Partsch | |
| 9,432,280 B2 * | 8/2016 | Kotalwar | H04L 45/28 |
| 2008/0219269 A1 | 9/2008 | Minkenberg et al. | |
| 2010/0083026 A1 | 4/2010 | Millet et al. | |
| 2011/0296216 A1 | 12/2011 | Looi et al. | |
| 2014/0177626 A1 | 6/2014 | Thottethodi et al. | |
| 2014/0181352 A1 | 6/2014 | Conrad et al. | |

FOREIGN PATENT DOCUMENTS

| | | |
|---|---|---|
| WO | 9704397 | 6/1997 |
| WO | 2013048391 | 4/2013 |

OTHER PUBLICATIONS

Japan Patent Office, First Office Action dated Sep. 13, 2016 in Japanese Patent Application No. 2015-185045.

Korea Intellectual Property Office, Notice of Preliminary Rejection dated Aug. 23, 2016 in Korean Patent Application No. 20150135176.

Patent Office of the Russian Federation, Office Action dated Dec. 12, 2016 in Russian Patent Application No. 2015141014.

European Patent Application Serial No. EP14382274.0, filed Jul. 14, 2014, entitled "A Method, Apparatus and System for a Modular On-Die Coherent Interconnect," by Intel Corporation.

U.S. Appl. No. 14/126,883, filed Dec. 17, 2013, entitled "On-Chip Mesh Interconnect," by Yen-Cheng Liu, et al.

Boris Grot, et al., "Express Cube Topologies for On-Chip Interconnects," Appears in the Proceedings of the 15th International Symposium on High-Performance Computer Architecture, 2009, 12 pages.

John Kim, et al., "Cost-Efficient Dragonfly Topology for Large-Scale Systems," 2009, 3 pages.

John Kim, et al., "Cost-Efficient Dragonfly Topology for Large-Scale Systems," Published by the IEEE Computer Society, 2009, 8 pages.

State Intellectual Property Office of the People's Republic of China, First Office Action dated Feb. 11, 2018 in Chinese Patent Application No. 201510621918.2.

\* cited by examiner

US 9,998,401 B2

ARCHITECTURE FOR ON-DIE INTERCONNECT

This application is a continuation of U.S. patent application Ser. No. 14/524,622, filed Oct. 27, 2014, the content of which is hereby incorporated by reference.

This invention was made with government support under B600738 awarded by Department of Energy National Nuclear Security Administration. The government has certain rights in the invention.

TECHNICAL FIELD

This disclosure pertains to computing systems, and in particular (but not limited to) on-die interconnects.

DETAILED DESCRIPTION

Figure 1A:
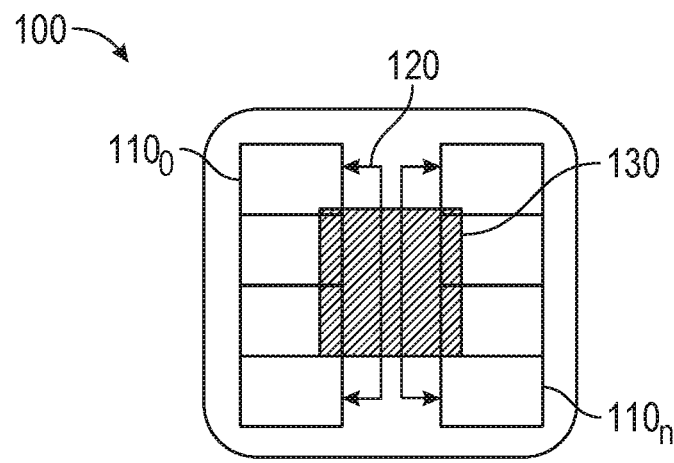
FIG. 1A is a block diagram of a collection or grouping of cores of a processor or SoC in accordance with an embodiment of the present invention.

As computing technology advances, greater amounts of compute capacity become feasible on a single semiconductor die. Currently, multi-core processors having 4, 8 or more cores are available. It is anticipated that future processors may integrate hundreds or even thousands of small compute cores onto a single silicon die. However, current on-die interconnect fabrics cannot efficiently scale up to such large numbers of nodes, particularly with minimal power consumption and latency, while providing acceptable bandwidth. Conventional network topologies including 2-dimension mesh, ring bus or ring mesh topologies cannot scale up efficiently for such anticipated processors, resulting in excessive latency and prohibitive power consumption, primarily due to large numbers of intermediate hops and buffering in the network.

In various embodiments, an on-die interconnect topology is provided to exploit abundant interconnect resources provided by state-of-the-art semiconductor process technology and unique latency/energy/bandwidth/repeater spacing characteristics of a hierarchical buildup of a metal stack. In this way, an interconnect fabric in accordance with an embodiment may achieve network scalability to 1000's of nodes with low latency/energy and acceptable bandwidth for application performance.

Embodiments leverage the presence of advanced technology nodes for sub-micron semiconductor processing. As an example, a metal stack adapted to a semiconductor die provides a rich set of metal resources (e.g., 9 or more layers). In an embodiment, 4 or more of these metal layers can be used for an on-die interconnect fabric. Each metal layer has different physical characteristics, including but not limited to different width/spacing/material properties. As examples, the different layers may have different energy characteristics (e.g., energy/millimeter (mm)), latency characteristics (e.g., delay/mm), bandwidth characteristics (wires/mm) and optimal repeater spacing characteristics. Note that in some embodiments, the size of cores or other compute logic to be interconnected may be smaller than optimal repeater spacing for higher level metals, and as such the need for repeaters can be avoided, and wires in higher level metal layers (which may be larger and/or thicker than those of a lower level metal layer) can provide lower latency and cross/traverse multiple cores in a single clock cycle.

An interconnect fabric in accordance with an embodiment can use a hierarchy of wires, where lower/mid-level layers include wires having sufficient bandwidth to couple between clusters of neighboring cores (or core groups) by point-to-point interconnects. In turn, higher level metal layers include wires that span across and connect to multiple core groups in a single clock cycle by point-to-multipoint interconnects. Embodiments provide a hierarchical network topology having a flattened logical switch hierarchy and hierarchies of wires that hierarchically couple physically/logically adjacent and distant nodes. Due to the small size of cores (nodes), it may not be feasible to flatten the switches on a per-core basis, and instead the topology may be flattened on a core grouping.

A topology as described herein incorporates high-radix flattened switches that are interconnected with hierarchical point-to-point and point-to-multipoint interconnects. Flattening the switch with increased connectivity for hierarchical wires increases the radix of the switch, minimizing hop count and overall network latency/energy. Individual switch energy does not increase significantly (to first order), as long as bandwidth is kept constant. The network topology can be optimized for a given technology (resources), core count and application requirements by striking a balance between switch radix, bandwidth and span and drop count of hierarchical wires. For example, the choice of metal width/spacing determines a trade-off between bandwidth/latency. Wide metal wires with more spacing result in lower latency at a cost of less bandwidth (wires per mm). Similarly if core size is reduced, more cores can be connected in a single cycle.

More specifically, embodiments use a flattened switch on a per-island basis. Groups of N cores (an island) share a network switch. Cores within an island are connected using a crossbar network. Referring now to FIG. 1A, shown is a block diagram of a collection or grouping of cores of a processor or SoC in accordance with an embodiment of the present invention. In FIG. 1A, collection 100 may be referred to herein as a domain or island. In some embodiments, islands may be of independent voltage and frequency domains. As seen, a plurality of cores $110_0$-$110_n$ are present. Although embodiments vary, in the illustrated example 8 cores are present; understand however that more or fewer cores may be present in a given island in different embodiments.

Cores 110 couple together via an interconnect 120 of a first topology. As an example, interconnect 120 may be a crossbar network to enable the cores to communicate with each other. Island 100 further includes a network switch 130. In an embodiment, switch 130 is a high-radix switch. Switch 130 provides for interconnection and communication between the cores within collection 100 and other portions of the processor or SoC (and in turn to off-chip locations). Further, as will be described herein, network switch 130 may communicate with other domains or islands by different types of interconnects, where at least portions of these interconnects are configured on different metal layers of a buildup stack. By leveraging the characteristics of the different metal layers of this buildup stack, which themselves have different properties, operating characteristics of the interconnects themselves such as latency, bandwidth, among other operating characteristics vary. Such characteristics may be a function of choice of width/spacing of metal wires. Lower layers may have tighter spacing and narrower widths, resulting in higher bandwidth (per mm) and higher latency due to increased resistance. Higher layers have wider widths and higher spacing, and as a result less bandwidth (per mm) but lower latency due to reduction in resistance.

In an example embodiment, a first set of output ports of network switch 130 communicates with adjacent domains or islands via point-to-point interconnects (not shown for ease of illustration in FIG. 1A). In turn, a second set of output ports of network switch 130 communicates with non-adjacent domains or islands via point-to-multipoint interconnects (not shown for ease of illustration in FIG. 1A). Understand while shown at this high level in the example of FIG. 1A, many variations and alternatives are possible.

Figure 1B:
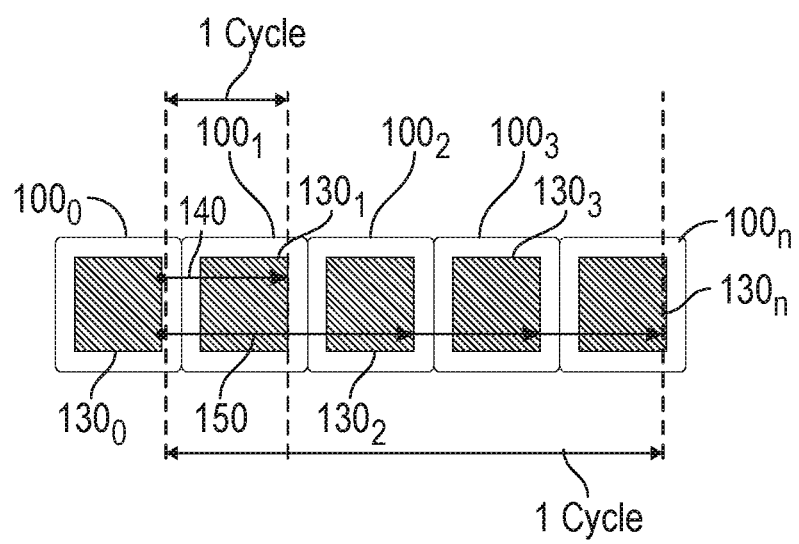
FIG. 1B is a block diagram of a plurality of processor islands in accordance with an embodiment.

Referring now to FIG. 1B, shown is a block diagram of a plurality of processor islands in accordance with an embodiment. As seen, five islands $100_0$-$100_n$ are present. While shown at a high and general level, understand that each island may include homogeneous resources, which can include a plurality of cores (e.g., 8), a crossbar interconnect network and a switch. By leveraging the unique characteristics of different metal layers on which at least portions of interconnects that couple the different islands together, different latencies of communications occur. Thus as seen in FIG. 1B in a single clock cycle (for example) a first output port of network switch $130_0$ provides an output unit (e.g., a packet) to a corresponding input port of a network switch $130_1$ of adjacent island $100_1$ via an interconnect 140, which in an embodiment is implemented as a point-to-point interconnect configured at least in part on a first metal layer (e.g., a mid-level metal layer of a buildup stack). Instead, a second output port of network switch $130_0$ provides an output unit to a corresponding input port of a plurality of network switches, namely network switches $130_2$, $130_3$, and $130_n$. Note that this communication from this output port of network switch $130_0$ may be via a point-to-multipoint interconnect 150 configured at least in part on a second metal layer (e.g., a higher metal layer of the buildup stack, at least higher than the mid-level metal layer).

While shown with this illustrative example in FIG. 1B, understand that embodiments are not limited to multipoint interconnects that couple only to three non-adjacent islands. In other embodiments, such interconnects may couple to additional non-adjacent interconnects (and optionally may also couple to an adjacent island as well). Furthermore, while described with this single cycle latency of communication, understand the scope of the present invention is not limited in this respect, and in other examples, communication latency to a given destination to which an interconnect is coupled can be less than or greater than a single cycle.

In one example, an on-die interconnect structure may be implemented for an exascale SoC or other processor having the following components: 2048 cores, organized as 256 islands with 8 cores/island in a 16×16 network of nodes and one switch per island. In this example topology, each network switch may include a plurality of output ports, with four ports to couple to nearest neighbors in four directions and four ports to couple to point-to-multipoint interconnects spanning four islands in each direction. Other assumptions of this design include dimension-ordered XY routing, with two virtual channels (one each for requests and response), 64 byte (B) packet size, and a minimum bandwidth of 64 gigabytes per second (Gbps) injection bandwidth per island under a uniform random traffic pattern.

Figure 2:
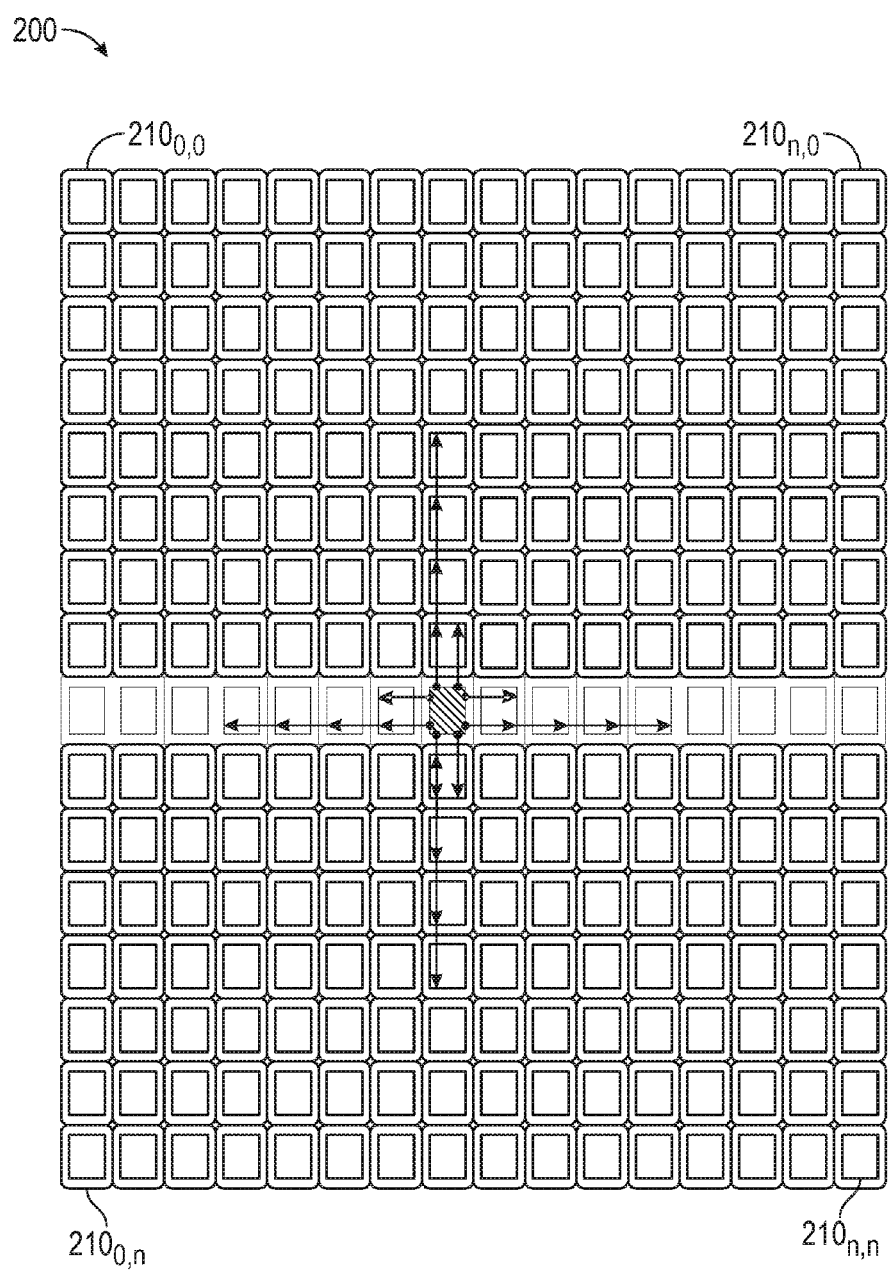
FIG. 2 is a block diagram of a SoC or other processor in accordance with an embodiment of the present invention.

Referring now to FIG. 2, shown is a block diagram of a SoC or other processor in accordance with an embodiment of the present invention. In the example of FIG. 2, processor 200 is an exascale processor including a very high number of cores. As examples, 1024 or 2048 cores may be present. In general, the cores may be arrayed in islands. In the high-level shown, a 16×16 array of islands $210_{0,0}$-$210_{n,n}$ are present. Each island may include a given number of cores. In different examples homogeneous cores or a mix of heterogeneous cores are contemplated. To provide interconnection, an on-die interconnect fabric may be implemented via a plurality of network switches, e.g., high-radix network switches present within each island, generally configured as described above with regard to FIGS. 1A and 1B.

As such, each network switch 130 couples via a first type of interconnect (namely point-to-point interconnects) to adjacent islands in X, Y directions (understand that the islands on the perimeter of the die may not couple to four adjacent islands). In addition, each network switch 130 further couples via a second type of interconnect (namely point-to-multipoint interconnects) to non-adjacent islands.

Note that a topology in accordance with an embodiment may achieve lowest latency under low load conditions, and for the same switch bandwidth, achieves up to three times higher injection rate before the network saturates under uniform random traffic conditions as compared to a 2D mesh network. For highly localized, nearest neighbor traffic pattern, the topology performs competitively as compared to 2D mesh network.

Understand that the topology of FIG. 2 is a generic topology example, and exact specifications may be based on technology choice, circuit parameters, core count/size, etc. Embodiments thus provide flexible implementation of an on-die interconnect fabric. Note that span and drop count of each point-to-multipoint interconnect can be defined by base technology specifications (e.g., number of metal layers, wires/mm, optimal repeater spacing and so forth), circuit parameters (e.g., voltage, clock cycle period, among others), and core count. These considerations may be balanced against desired network diameter (energy/latency) and bandwidth. For a given injection/ejection bandwidth of the network switch, a higher number of wires/mm for mid-layer metals can be used to provide higher bandwidth for local communication.

Figure 3:
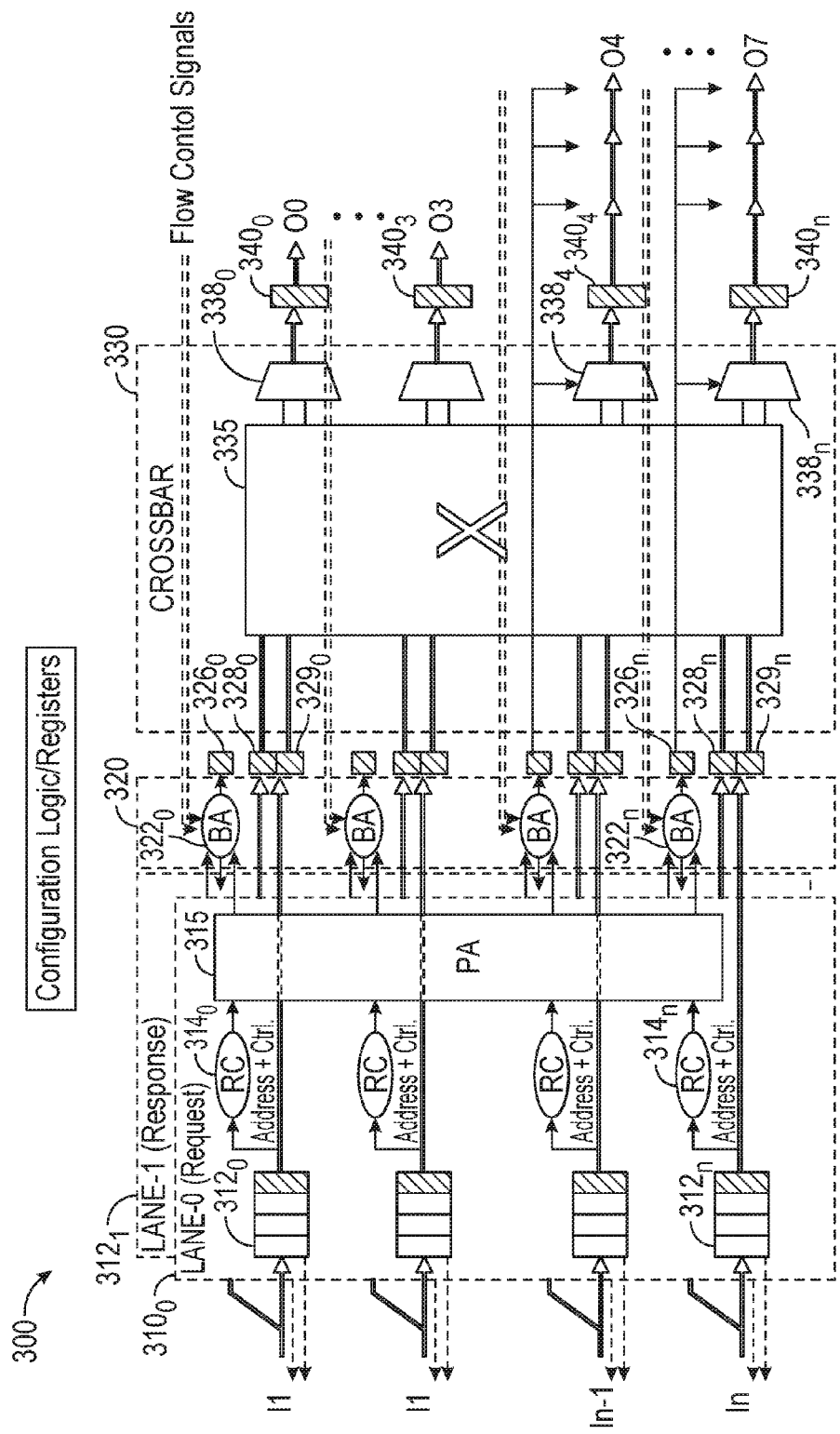
FIG. 3 is a block diagram of a network switch in accordance with an embodiment of the present invention.

Referring now to FIG. 3, shown is a block diagram of a network switch in accordance with an embodiment of the present invention. As shown in FIG. 3, network switch 300 may be instantiated throughout different domains or islands of a processor or SoC. Using this switch, various routing, arbitration and related operations can be performed. As seen, network switch 300 receives input via a plurality of input ports I0-In, which are configured to receive inputs from other islands (e.g., as received via point-to-point interconnects or point-to-multipoint interconnects). Other input ports may be coupled to various local cores of the island in which network switch 300 is included. As such, there are more input ports than a number of output ports (in the embodiment shown, output ports O0-O7 are provided).

With reference to incoming information, which may be in the form of request information or response information, the incoming information is provided to a corresponding lane or virtual channel $310_0$ which corresponds to a request virtual channel, and virtual channel $310_1$ which corresponds to a response virtual channel. As seen, each channel includes a number of independent buffers $312_0$-$312_n$. The incoming information, which may be received in given input units, e.g., of a packet size for a given processor, are provided to a route compute logic $314_0$-$314_n$ to determine an appropriate destination for the corresponding, e.g., based on address and control information included in the given packet. Based on this route-determined information, a port arbitration may be performed in a port arbiter 315 to determine an appropriate output port to which to deliver the given packet.

However, before output a bus arbitration first occurs in a bus arbiter 320. As seen, at this point of arbitration, flow control information is considered to determine whether a given destination has sufficient resources to receive a corresponding packet. Thus as seen, flow control information may be provided in feedback fashion to bus arbiter 320 (and more specifically to the independent bus arbitration logics $322_0$-$322_n$).

The arbitrated packets from the corresponding bus arbitrartion logics 322 are provided to corresponding pipe stages $326_0$, $328_0$, $329_0$-$326_n$, $328_n$, $329_n$. As seen, the packets are provided to a crossbar router 330, including crossbar logic 335. In this way, the packets may be provided to a selected destination (including local cores coupled to crossbar network 330, not shown for ease of illustration in FIG. 3). As shown, for a package to be output from a given output port of network switch 300, communication is via a corresponding selector or multiplexer $338_0$-$338_7$. As such, output packets are provided either to adjacent islands via pipe stages $340_0$-$340_3$ coupled to output ports O0-O3 (each in turn coupled to a point-to-point interconnect) where the packets can be communicated with a one cycle latency to the adjacent network switches of the adjacent islands. Instead, packets to be provided to one of multiple non-adjacent islands via associated network switches are sent from multiplexers $338_4$-$338_7$ and through corresponding pipe stages $340_4$-$340_7$ to corresponding output ports O4-O7 (each in turn coupled to a point-to-multipoint interconnect).

Thus as illustrated, network switch 300 is a high-radix switch for an on-die fabric. While shown with this particular illustration having separate lanes or virtual channels for requests and responses, understand the scope of the present invention is not limited in this regard and in other implementations additional or different virtual channels may be provided.

Figure 4:
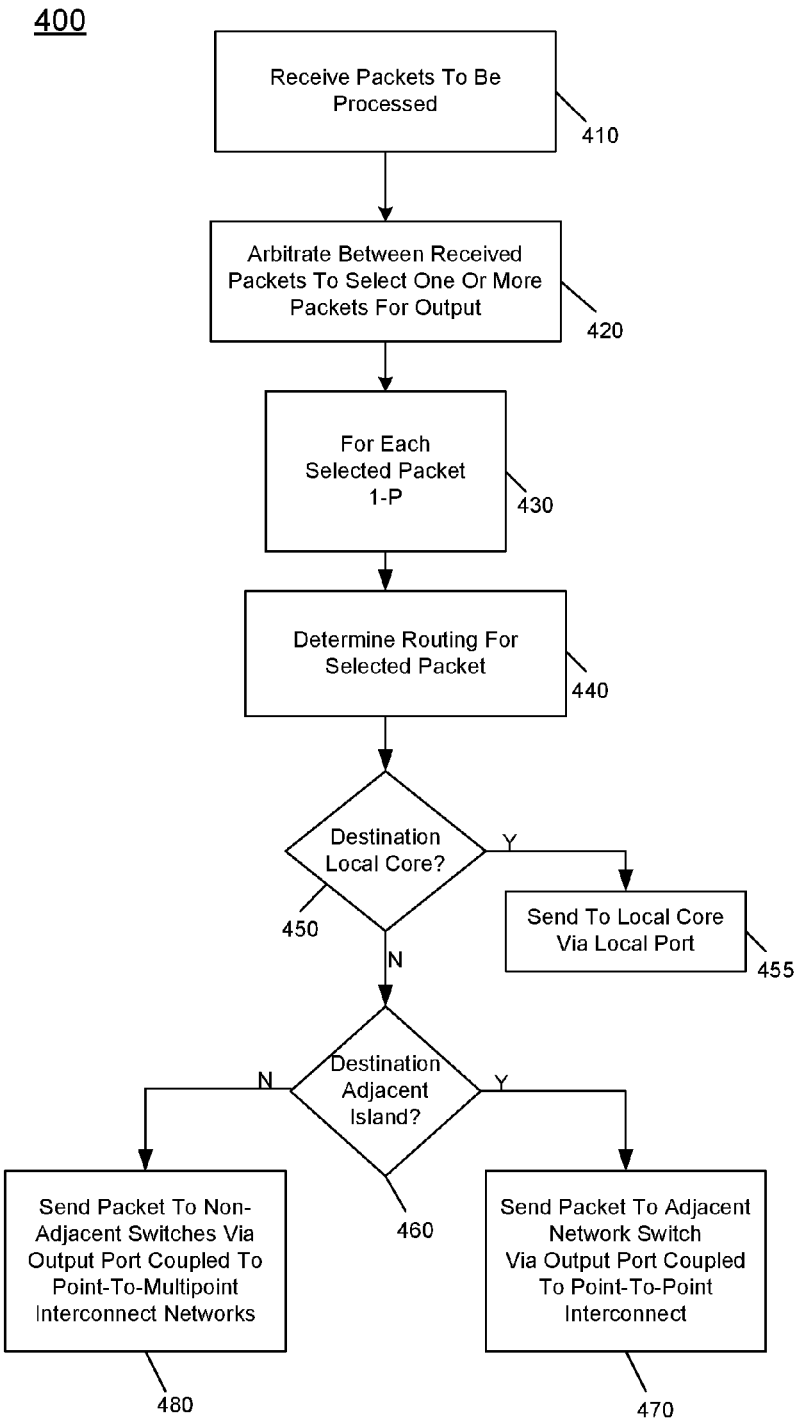
FIG. 4 is a flow diagram of a method of routing packets through a network switch in accordance with an embodiment of the present invention.

Referring now to FIG. 4, shown is a flow diagram of a method of routing packets through a network switch in accordance with an embodiment of the present invention. As shown in FIG. 4, method 400 may be performed by various logic within a network switch. As seen, method 400 begins by receiving multiple packets to be processed (block 410). Such packets may be received within the network switch from its local cores, as well as from point-to-point and point-to-multipoint interconnects coupled to the various input ports of the network switch. Next at block 420, an arbitration may be performed to determine appropriate packets for output. Arbitration may be based on a round-robin arbitration, with consideration for fairness such that packets from particular sources do not starve or prevent other source's packets from being sent. Still further, the arbitration, including port and bus arbitration, may also consider flow control information such that packets are not selected where the destination does not have sufficient resources to handle the incoming packets.

Still referring to FIG. 4, next at block 430 a process may be performed by the network switch logic for each given packet to be output (e.g., packets 1-P, where there are fewer output ports than input ports). As seen, routing for the selected packet may be determined (block 440). Then based on the routing it can be determined whether the destination is a local core (diamond 450). If so, control passes to block 455 for the given packet, where it can be sent to the local core via a local port (which may be part of the crossbar network to thus provide the packet to the island-internal core).

Instead if the destination is not a local core, control passes to diamond 460 to determine whether the destination is within an adjacent island. If so, control passes to block 470 where the packet may be sent to an adjacent network switch via an output port that is coupled to a point-to-point interconnect. Otherwise, if the destination is not an adjacent island, control passes to block 470 where the packet may be sent to multiple non-adjacent network switches via an output port coupled to a point-to-multipoint interconnect. Note that when sending a packet on a point-to-multipoint interconnect, sideband control signals also may be provided to ensure that the packet is sinked only at the switch that is to act a hop to forward the packet on to a final destination (which may be based on routing tables within the given network switches. Thus, the packet is not sinked to other (non-destination/non-hop) switches coupled to the interconnect. In this way, by using the sideband interconnect information, a packet does not have to go through route computation at non-destination switches. Although shown at this high level in the embodiment of FIG. 4, understand the scope of the present invention is not limited in this regard.

Figure 5:
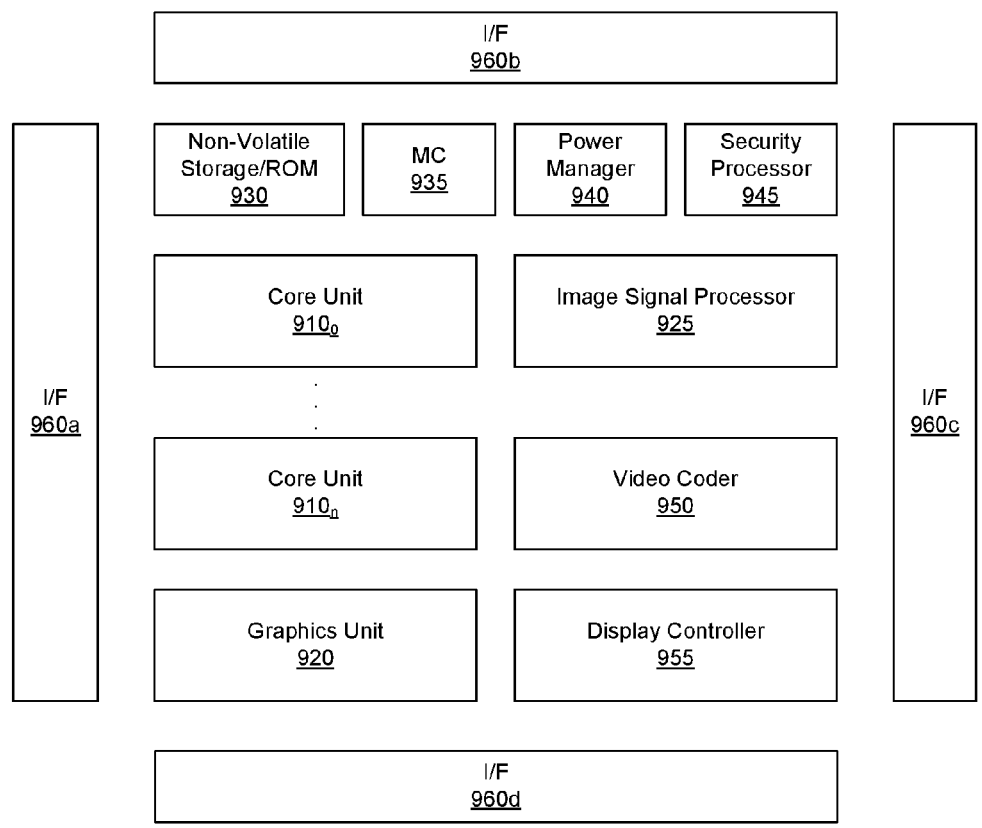
FIG. 5 is a block diagram of a system in accordance with an embodiment of the present invention.

Understand that exascale processors or SoCs (or other integrated circuits) including an on-die interconnect as described herein can be used in many different systems, ranging from small portable devices to high performance computing systems and networks. Referring now to FIG. 5, shown is a block diagram of a system in accordance with an embodiment of the present invention. In the embodiment of FIG. 5, system 900 may be a SoC including multiple domains, each of which may be controlled to operate at an independent operating voltage and operating frequency. Note that the domains each may be a heterogeneous island including a network switch and interconnected as described herein. As a specific illustrative example, system 900 may be an Intel® Architecture Core™-based SoC such as an i3, i5, i7 or another such processor available from Intel Corporation. However, other low power SoCs or processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer, IoT device, wearable, or other portable computing device.

In the high level view shown in FIG. 5, SoC 900 includes a plurality of core units $910_0$-$910_n$. Each core unit may include one or more processor cores, one or more cache memories and other circuitry. Each core unit 910 may support one or more instructions sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level (L2) cache memory. A non-volatile storage 930 may be used to store various program and other data. For example, this storage may be used to store at least portions of microcode, boot information such as a BIOS, other system software or so forth.

Each core unit 910 may also include an interface such as a network interface to enable interconnection to additional circuitry of the SoC. In an embodiment, each core unit 910 couples to a coherent fabric formed of an on-die interconnect that may act as a primary cache coherent on-die interconnect that in turn couples to a memory controller 935. In turn, memory controller 935 controls communications with a memory such as a DRAM (not shown for ease of illustration in FIG. 5).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 5, a video coder 950 may perform coding operations including encoding and decoding for video information, e.g., providing hardware acceleration support for high definition video content. A display controller 955 further may be provided to accelerate display operations including providing support for internal and external displays of a system. In addition, a security processor 945 may be present to perform security operations. Each of the units may have its power consumption controlled via a power manager 940, which may include control logic to perform various power management techniques.

In some embodiments, SoC 900 may further include a non-coherent fabric coupled to the coherent fabric to which various peripheral devices may couple. One or more interfaces 960a-960d enable communication with one or more off-chip devices. Such communications may be according to a variety of communication protocols such as PCIe™ GPIO, USB, I²C, UART, MIPI, SDIO, DDR, SPI, HDMI, among other types of communication protocols. Although shown at this high level in the embodiment of FIG. 5, understand the scope of the present invention is not limited in this regard.

Figure 6:
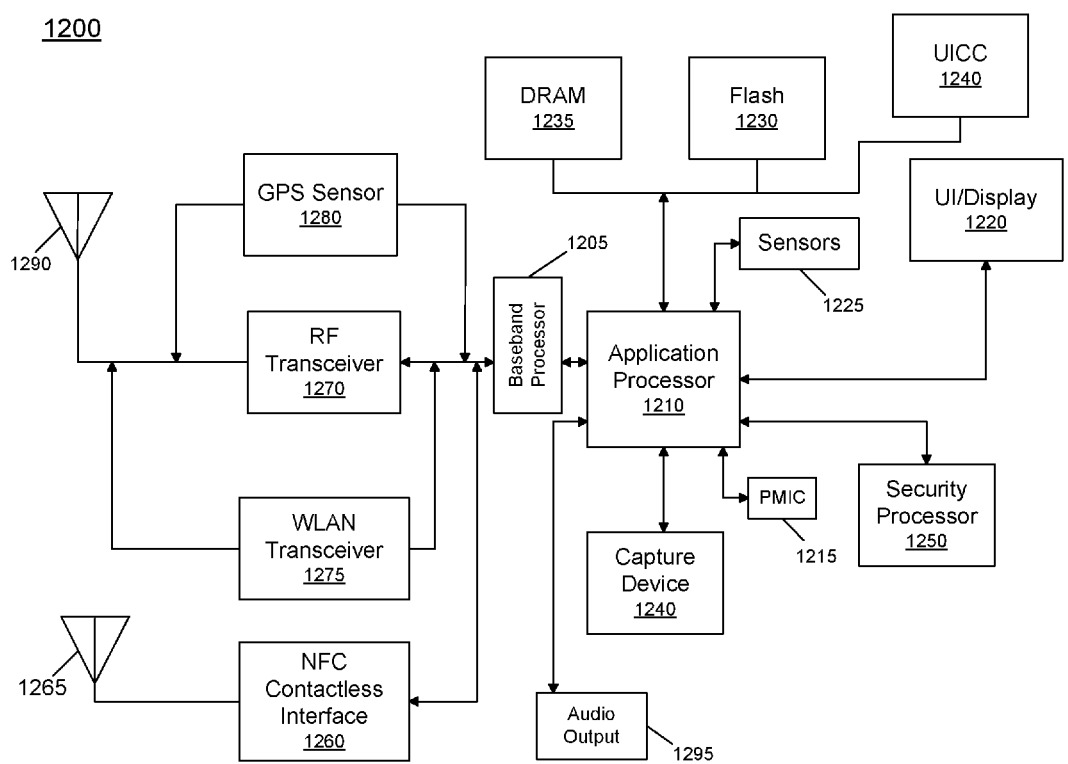
FIG. 6 is a block diagram of an example system with which embodiments can be used.

Referring now to FIG. 6, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main SoC of the system to execute an OS and other system software, in addition to user applications such as many well-known social media and multimedia apps. Application processor 1210 may further be configured to perform a variety of other computing operations for the device, and may include an on-die interconnect architecture as described herein.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 6, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 6, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications, such as according to a Bluetooth™ standard or an IEEE 802.11 standard such as IEEE 802.11a/b/g/n can also be realized.

Figure 7:
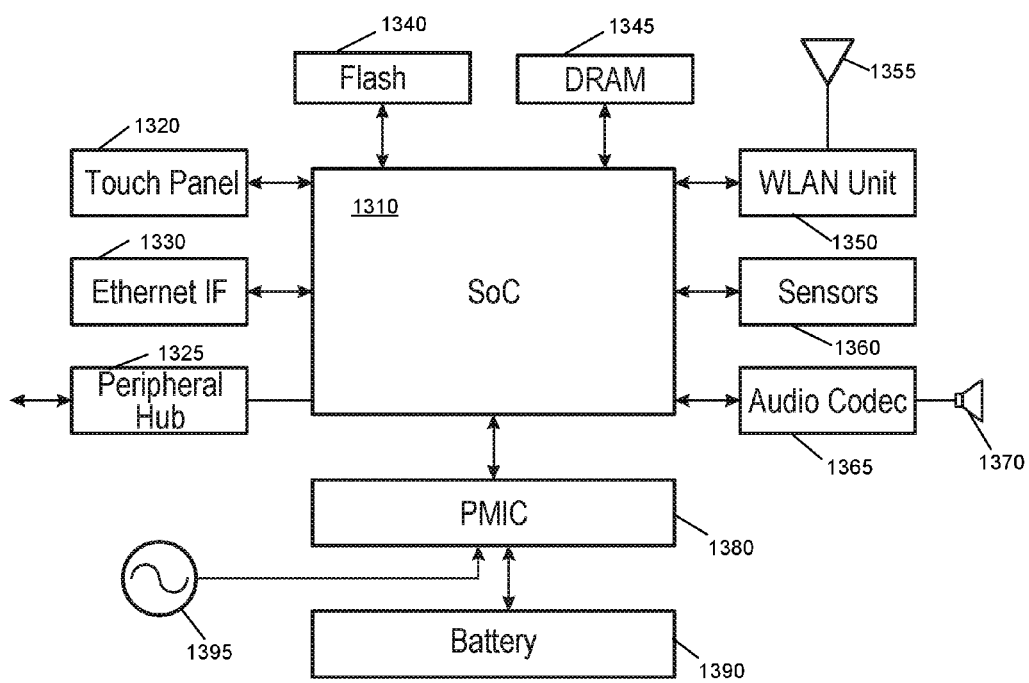
FIG. 7 is a block diagram of another example system with which embodiments may be used.

Referring now to FIG. 7, shown is a block diagram of another example system with which embodiments may be used. In the illustration of FIG. 7, system 1300 may be mobile low-power system such as a tablet computer, 2:1 tablet, phablet or other convertible or standalone tablet system. As illustrated, a SoC 1310 is present and may be configured to operate as an application processor for the device. SoC 1310 may include an on-die interconnect architecture as described herein.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 7, to provide for wireless capabilities, a WLAN unit 1350 is coupled to SoC 1310 and in turn to an antenna 1355. In various implementations, WLAN unit 1350 may provide for communication according to one or more wireless protocols, including an IEEE 802.11 protocol, a Bluetooth™ protocol or any other wireless protocol.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 7, many variations and alternatives are possible.

Figure 8:
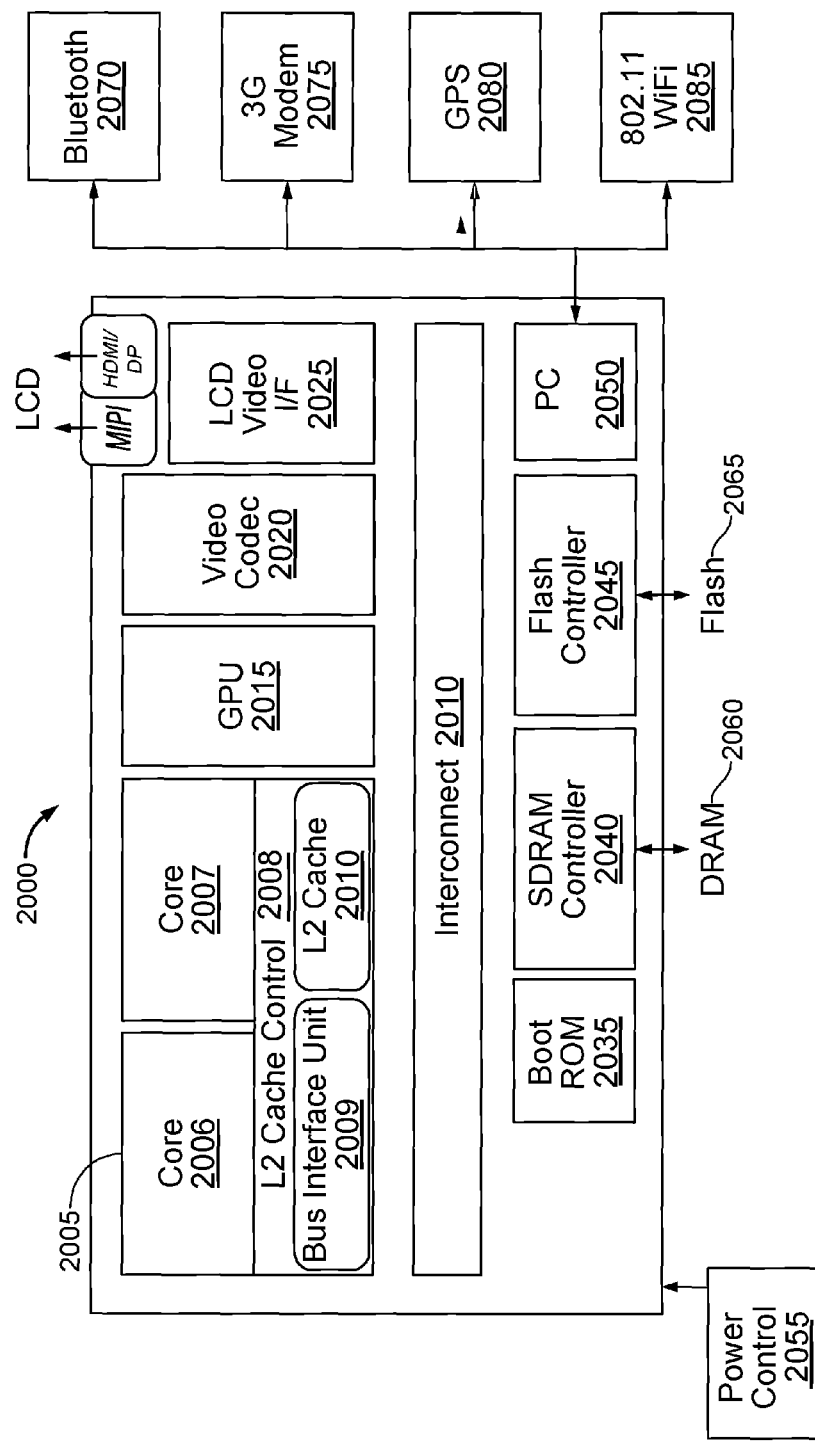
FIG. 8 is a block diagram of a system on a chip in accordance with an embodiment.

Turning next to FIG. 8, an embodiment of a SoC design in accordance with an embodiment is depicted. As a specific illustrative example, SoC 2000 is included in user equipment (UE). In one embodiment, UE refers to any device to be used by an end user, such as a wearable, hand-held phone, smartphone, tablet, ultra-thin notebook, notebook IoT device, or any other similar device. Often a UE connects to a base station or node, which potentially corresponds in nature to a mobile station (MS) in a GSM network.

Here, SoC 2000 includes 2 cores—2006 and 2007. Similar to the discussion above, cores 2006 and 2007 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 2006 and 2007 are coupled to cache control 2008 that is associated with bus interface unit 2009 and L2 cache 2010 to communicate with other parts of system 2000. Interconnect 2010 includes an on-chip interconnect, which may be of the heterogeneous hierarchical architecture described herein.

Interconnect 2010 provides communication channels to the other components, such as a boot ROM 2035 to hold boot code for execution by cores 2006 and 2007 to initialize and boot SOC 2000, a SDRAM controller 2040 to interface with external memory (e.g. DRAM 2060), a flash controller 2045 to interface with non-volatile memory (e.g. Flash 2065), a peripheral controller 2050 (e.g. Serial Peripheral Interface) to interface with peripherals, video codecs 2020 and Video interface 2025 to display and receive input (e.g. touch enabled input) via one of MIPI or HDMI/DP interface, GPU 2015 to perform graphics related computations, etc.

In addition, the system illustrates peripherals for communication, such as a Bluetooth module 2070, 3G modem 2075, GPS 2080, and WiFi 2085. Also included in the system is a power controller 2055.

Figure 9:
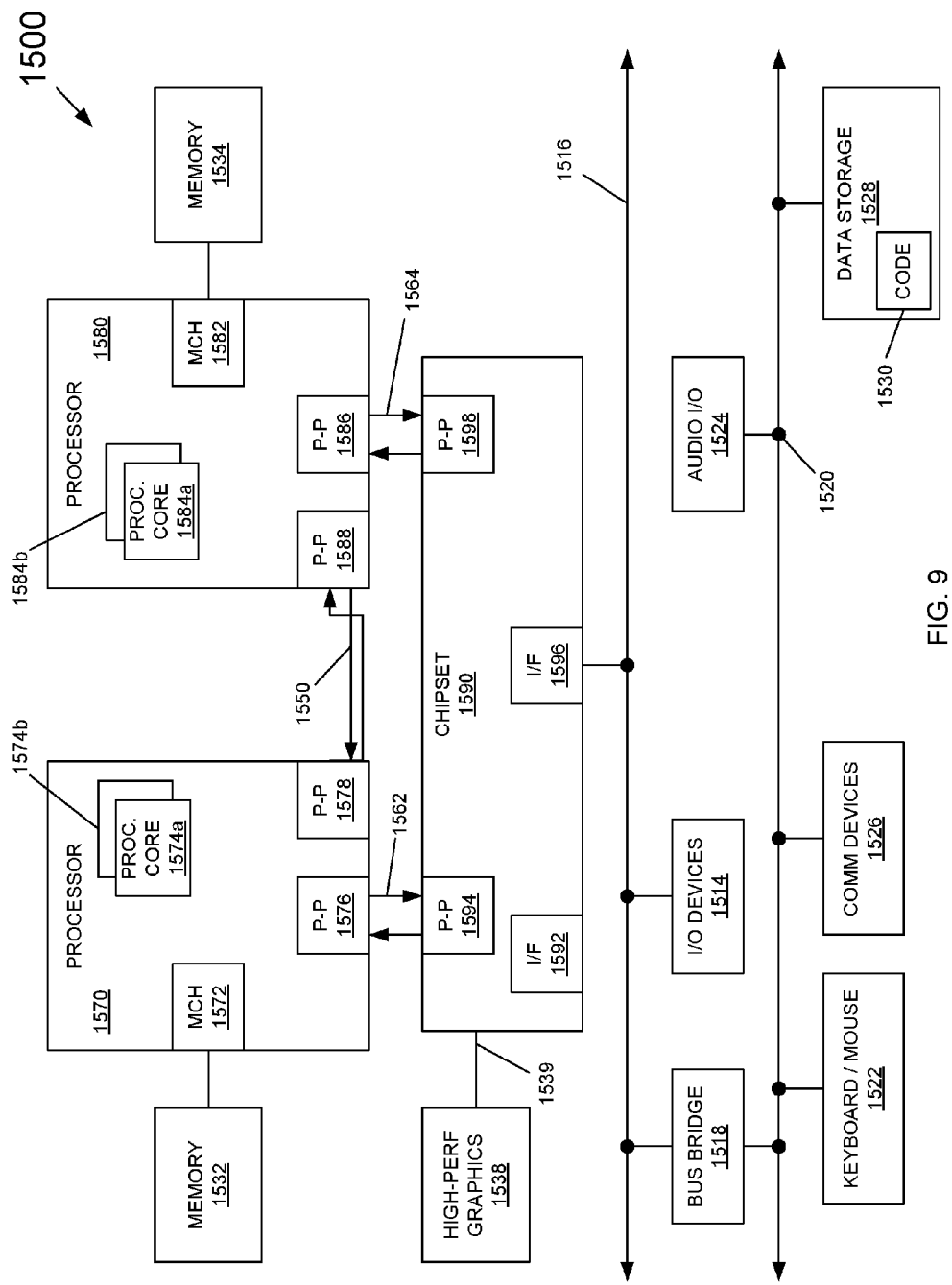
FIG. 9 is a block diagram of a system in accordance with an embodiment of the present invention.

Referring now to FIG. 9, shown is a block diagram of a system in accordance with an embodiment of the present invention. As shown in FIG. 9, multiprocessor system 1500 such as a high performing computing system that may in turn couple to other systems of a HPC network. System 1500 includes a first processor 1570 and a second processor 1580 coupled via a point-to-point interconnect 1550. As shown in FIG. 9, each of processors 1570 and 1580 may be many core processors including representative first and second processor cores (i.e., processor cores 1574a and 1574b and processor cores 1584a and 1584b), e.g., of two islands of the 100's or more islands that may interconnect via an on-die interconnect architecture as described herein.

Still referring to FIG. 9, first processor 1570 further includes a memory controller hub (MCH) 1572 and point-to-point (P-P) interfaces 1576 and 1578. Similarly, second processor 1580 includes a MCH 1582 and P-P interfaces 1586 and 1588. As shown in FIG. 9, MCH's 1572 and 1582 couple the processors to respective memories, namely a memory 1532 and a memory 1534, which may be portions of system memory (e.g., DRAM) locally attached to the respective processors. First processor 1570 and second processor 1580 may be coupled to a chip set 1590 via P-P interconnects 1562 and 1564, respectively. As shown in FIG. 9, chip set 1590 includes P-P interfaces 1594 and 1598.

Furthermore, chipset 1590 includes an interface 1592 to couple chip set 1590 with a high performance graphics engine 1538, by a P-P interconnect 1539. In turn, chipset 1590 may be coupled to a first bus 1516 via an interface 1596. As shown in FIG. 9, various input/output (I/O) devices 1514 may be coupled to first bus 1516, along with a bus bridge 1518 which couples first bus 1516 to a second bus 1520. Various devices may be coupled to second bus 1520 including, for example, a keyboard/mouse 1522, communication devices 1526 and a data storage unit 1528 such as a disk drive or other mass storage device which may include code 1530, in one embodiment. Further, an audio I/O 1524 may be coupled to second bus 1520.

The following examples pertain to further embodiments.

In one example, an apparatus comprises: a plurality of islands configured on a semiconductor die, at least two of the plurality of islands having a plurality of cores; and a plurality of network switches configured on the semiconductor die that are to be associated with the plurality of islands, where a first network switch of the plurality of network switches comprises a plurality of output ports, output ports of a first set of the plurality of output ports are to couple to the associated network switch of an island via a point-to-point interconnect and output ports of a second set of the output ports are to couple to the associated network switches of a plurality of islands via a point-to-multipoint interconnect.

In an example, the point-to-point interconnect is configured at least in part on a first metal layer.

In an example, the point-to-multipoint interconnect is configured at least in part on a second metal layer, the second metal layer a higher metal layer than the first metal layer.

In an example, a wire width of the point-to-point interconnect configured on the first metal layer is greater than a wire width of the point-to-multipoint interconnect configured on the higher metal layer.

In an example, the point-to-multipoint interconnect is configured to communicate output information from the network switch to the associated network switches of the plurality of islands in a clock cycle, the plurality of islands physically non-adjacent to the island of the network switch.

In an example, the point-to-point interconnect is configured to communicate output information from the network switch to the associated network switch of the island in a clock cycle, the island physically adjacent to the island of the network switch.

In an example, the apparatus further comprises an on-die interconnect fabric comprising the plurality of network switches, the point-to-point interconnects and the point-to-multipoint interconnects.

In an example, the on-die interconnect fabric comprises a hierarchical network including a plurality of crossbar networks each to interconnect the plurality of cores of an island, a plurality of point-to-point interconnects to interconnect adjacent ones of the plurality of islands, and a plurality of point-to-multipoint interconnects to interconnect non-adjacent ones of the plurality of islands.

In another example, an apparatus comprises: a network switch configured on a semiconductor die, the network switch including: a plurality of input ports to receive information from other network switches; a first plurality of output ports to couple to a plurality of adjacent network switches via a first metal layer; and a second plurality of output ports to couple to a plurality of non-adjacent network switches via a second metal layer.

In an example, the number of the plurality of input ports is greater than a sum of the number of the first plurality of output ports and the number of the second plurality of output ports.

In an example, the network switch further comprises: at least one first buffer associated with a first virtual channel; at least one second buffer associated with a second virtual channel; a crossbar network to couple a plurality of cores to the network switch, wherein the plurality of cores are of an island; and an arbiter to arbitrate between output requests from at least some of the plurality of cores.

In an example, at least one of the first plurality of output ports is to couple to the adjacent network switch via a point-to-point interconnect configured at least in part on the first metal layer.

In an example, at least one of the second plurality of output ports is to couple to the plurality of non-adjacent network switches via a point-to-multipoint interconnect configured at least in part on the second metal layer, the second metal layer a higher layer than the first metal layer, where the first and second metal layers are of a buildup stack configured on a semiconductor die.

In an example, at least one of the first plurality of output ports is to communicate an output unit to the adjacent network switch in a first clock cycle and at least one of the second plurality of output ports is to communicate an output unit to the plurality of non-adjacent network switches in the first clock cycle.

In an example, the apparatus comprises an exascale SoC including a plurality of cores.

In an example, the exascale SoC comprises a plurality of islands each having a portion of the plurality of cores and a network switch.

In another example, a machine-readable medium having stored thereon instructions, which if performed by a machine cause the machine to perform a method comprising: receiving a plurality of packets in a network switch of an on-die interconnect; determining a routing for a first packet of the plurality of packets; sending the first packet to an adjacent network switch via a first output port coupled to a point-to-point interconnect if the first packet is destined for a destination logic in a domain associated with the adjacent network switch; and sending the first packet to a plurality of non-adjacent network switches via a second output port coupled to a point-to-multipoint interconnect if the first packet is destined for a destination logic in a domain associated with one of the plurality of non-adjacent network switches.

In an example, the method further comprises sending the first packet to a local core of a domain including the network switch if the first packet is destined for the local core.

In an example, the method further comprises sending the first packet to the adjacent network switch via the point-to-point interconnect configured at least in part on a first metal layer.

In an example, the method further comprises sending the first packet to the plurality of non-adjacent network switches via the point-to-multipoint interconnect configured at least in part on a second metal layer, the second metal layer a higher metal layer than the first metal layer.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
a plurality of domains adapted on a semiconductor die, at least two of the plurality of domains having a plurality of cores; and
a plurality of network switches adapted on the semiconductor die, wherein a first network switch of the plurality of network switches comprises a plurality of output ports, wherein at least one first output port of the plurality of output ports is to couple via a point-to-point interconnect to a second network switch associated with a second domain and at least one second output port of the plurality of output ports is to couple via a point-to-multipoint interconnect to a first subset of network switches associated with a first subset of domains.

2. The processor of claim 1, wherein the point-to-point interconnect is adapted at least in part on a first metal layer and the point-to-multipoint interconnect is adapted at least in part on a second metal layer, the second metal layer a higher metal layer than the first metal layer.

3. The processor of claim 2, wherein a wire width of the point-to-point interconnect adapted on the first metal layer is greater than a wire width of the point-to-multipoint interconnect adapted on the higher metal layer.

4. The processor of claim 1, wherein the point-to-multipoint interconnect is adapted to communicate output information from the first network switch to the first subset of network switches in a clock cycle, the first subset of domains physically non-adjacent to the first network switch.

5. The processor of claim 4, wherein the point-to-point interconnect is adapted to communicate output information from the first network switch to the second network switch in a clock cycle, the first network switch physically adjacent to the second domain.

6. The processor of claim 1, wherein the first network switch comprises a high-radix switch.

7. The processor of claim 1, further comprising an on-die interconnect fabric comprising the plurality of network switches, the point-to-point interconnect and the point-to-multipoint interconnect.

8. The processor of claim 1, wherein a first domain comprises an independent frequency and a voltage domain.

9. The processor of claim 1, wherein the processor further comprises an image signal processor.

10. The processor of claim 1, wherein the processor further comprises a security processor.

11. A system-on-chip (SoC) comprising:
a plurality of cores adapted on a semiconductor die;
a network switch adapted on the semiconductor die, the network switch including:
a plurality of input ports to receive information;
a first plurality of output ports to couple to a plurality of adjacent network switches via a plurality of first interconnects adapted at least in part on a first metal layer; and
a second plurality of output ports to couple to a plurality of non-adjacent network switches via a plurality of second interconnects adapted at least in part on a second metal layer.

12. The SoC of claim 11, wherein the number of the plurality of input ports is greater than a sum of the number of the first plurality of output ports and the number of the second plurality of output ports.

13. The SoC of claim 11, wherein the network switch further comprises:
at least one first buffer associated with a first virtual channel;
at least one second buffer associated with a second virtual channel;
a crossbar network to couple the plurality of cores to the network switch; and
an arbiter to arbitrate between output requests from at least some of the plurality of cores.

14. The SoC of claim 11, wherein the plurality of first interconnects comprises point-to-point interconnects.

15. The SoC of claim 14, wherein the plurality of second interconnects comprises point-to-multipoint interconnects and the second metal layer is a higher layer than the first metal layer.

16. The SoC of claim 15, wherein at least one of the first plurality of output ports is to communicate an output unit to a first adjacent network switch in a first clock cycle and at least one of the second plurality of output ports is to communicate an output unit to the plurality of non-adjacent network switches in the first clock cycle.

17. The SoC of claim 11, wherein the SoC comprises an exascale SoC.

18. A machine-readable medium having stored thereon instructions, which when performed by a machine cause the machine to perform a method comprising:
receiving a plurality of packets in a network switch of a processor;
determining, in the network switch, a routing for a first packet of the plurality of packets;
sending the first packet to an adjacent network switch from a first output port of the network switch coupled to a point-to-point interconnect if the first packet is destined for a destination in a domain associated with the adjacent network switch; and
sending the first packet to a plurality of non-adjacent network switches from a second output port of the network switch coupled to a point-to-multipoint interconnect if the first packet is destined for a destination in a domain associated with one of the plurality of non-adjacent network switches.

19. The machine-readable medium of claim 18, wherein the method further comprises sending the first packet to a local core of a domain including the network switch if the first packet is destined for the local core.

20. The machine-readable medium of claim 18, wherein the method further comprises sending the first packet to the adjacent network switch via the point-to-point interconnect adapted at least in part on a first metal layer and sending the first packet to the plurality of non-adjacent network switches via the point-to-multipoint interconnect adapted at least in part on a second metal layer, the second metal layer a higher metal layer than the first metal layer.

* * * * *